(12) United States Patent
Langan et al.

(10) Patent No.: US 6,837,250 B2
(45) Date of Patent: Jan. 4, 2005

(54) CVD CHAMBER CLEANING USING MIXED PFCS FROM CAPTURE/RECYCLE

(75) Inventors: John Giles Langan, Pleasanton, CA (US); Andrew David Johnson, Doylestown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 332 days.

(21) Appl. No.: 10/085,249

(22) Filed: Feb. 27, 2002

(65) Prior Publication Data

US 2003/0164177 A1 Sep. 4, 2003

(51) Int. Cl.$^7$ .............................. B08B 6/00; B08B 9/00
(52) U.S. Cl. ......................... 134/1.1; 134/1.2; 134/10; 134/22.1; 438/905; 216/67
(58) Field of Search ............................ 134/1.1, 1.2, 10, 134/22.1; 216/60, 67, 79; 438/905; 156/345

(56) References Cited

U.S. PATENT DOCUMENTS

| | | | |
|---|---|---|---|
| 5,502,969 A | | 4/1996 | Jin et al. ........................ 62/11 |
| 6,030,591 A | * | 2/2000 | Tom et al. ............... 423/240 S |
| 6,517,913 B1 | * | 2/2003 | Cheung et al. ............. 427/588 |
| 6,540,930 B2 | * | 4/2003 | Kesari et al. ................. 216/67 |
| 2002/0134429 A1 | * | 9/2002 | Kubota et al. ............... 137/240 |

OTHER PUBLICATIONS

"Recovery of Perfluorocompounds . . . ", Foder, et al, Elec. Society Proc. vol. 99–8 pp. 60–69.
"Minimizing PFC Emissions From Existing . . . ", Johnson, et al, Semicon West 2000.
"Electrical Optimization of Plasma–enhanced Chemical . . . " Sobolewski, et al, J. Vac. Sci. Technol. B 16(1), 1998.
"Reduction of PFC Emissions by Gas Circulation Cleaning . . . ", R. Nakata, et al, IEEEE Int'l Sym . . . , No. 58827, 2001, pp. 229–232.

* cited by examiner

*Primary Examiner*—Michael Barr
*Assistant Examiner*—Saeed Chaudhry
(74) *Attorney, Agent, or Firm*—Geoffrey L. Chase

(57) ABSTRACT

A method of using PFCs recovered from the effluent of a CVD chamber cleaning process as an influent for the cleaning process is provided which includes the steps of selecting a first PFC gas mixture having a first ratio of $C_2F_6$ to $CF_4$, providing the first PFC gas mixture as the influent gas to the CVD chamber to create a CVD chamber effluent gas of a second PFC gas mixture having a second ratio of $C_2F_6$ to $CF_4$, adding virgin $C_2F_6$ or $CF_4$ to the CVD chamber effluent gas in sufficient quantity to create a third PFC gas mixture having the first ratio of $C_2F_6$ to $CF_4$, and using the third PFC gas mixture as the influent gas to the CVD chamber.

8 Claims, 3 Drawing Sheets

CVD CHAMBER CLEANING USING MIXED PFCS FROM CAPTURE/RECYCLE

BACKGROUND OF THE INVENTION

The present invention is directed to recapture and/or recycle of perfluorocompounds (PFCs). In particular, the present invention is directed to recovery of PFCs used in semiconductor manufacturing processes for use in chemical vapor deposition (CVD) chamber cleaning.

PFC gas mixtures or compounds (e.g., $C_2F_6$ or $CF_4$) are used in semiconductor manufacturing processes as a convenient source of fluorine for the plasma etching of silicon-based materials (e.g., $SiO_2$, $SiN_x$, poly-Si). Due to strong infrared absorbances and long atmospheric lifetimes, however, PFCs are suspected of contributing to global warming. Responding to this concern, the global semiconductor industry has voluntarily agreed to minimize its PFC emissions. Reduction targets for the U.S., Europe and Japan are 10% of 1995 levels by the year 2010. A strategy for achieving these emissions reductions is to capture the PFCs from the process effluent. For example, a membrane-based PFC recovery system has been demonstrated in M. Foder, R. Wimmer, J. Yang, and T. McCay, "Recovery of Perfluorocompounds (PFCs) from Semiconductor Manufacturing Processes Using a Membrane-Based System,", *ECS Proceedings*, 99-8, 60 (1999).

Additionally, typically, CVD chambers are cleaned using a $C_2F_6/O_2$-based RF plasma process as follows:

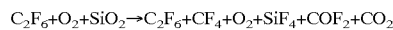

Here, PFC recovery is necessary because the influent $C_2F_6$ is not completely utilized, i.e., the influent stream as well as the effluent stream contains $C_2F_6$. Also, the plasma process generates some $CF_4$. Since the PFC recovery system removes all of the acid gases (e.g., $SiF_4$, $COF_2$ and HF) and is designed to separate PFCs from atmospherics gases (e.g., $O_2$, $N_2$, $CO_2$), the captured material is a mixture of both $C_2F_6$ and $CF_4$. The generation of $CF_4$ during the CVD chamber clean process makes using the recovered PFC gas more difficult.

Attempts to reuse the recovered PFCs have focused on separating the mixture into its components ($C_2F_6$ and $CF_4$) followed by further purification. See, e.g., U.S. Pat. No. 5,502,969 (Jin et al.) directed to a cryogenic rectification system for fluorine compound recovery. Recovered $C_2F_6$ can then be used in existing $C_2F_6$-based chamber clean processes. The goal is for the recovered components to meet the purity specifications of the virgin product. All impurities (including other PFCs) must only be present at trace levels. Typically, impurity levels required are less than 5 parts per million (ppm) except for $N_2$ which is around 250 ppm and $O_2$ which is around 100 ppm.

A process has also been developed whereby the PFC mixture is separated into its components via cryogenic distillation. The concentration of impurities in recovered $C_2F_6$ can indeed be reduced to the levels of virgin product. The shortcoming of this approach is economic. The cost of separating the PFC mixture and subsequent purification is higher than the cost of manufacturing the virgin $C_2F_6$ material. Additionally, distillation could be difficult if the recovered PFC's contain unsaturated fluorocarbons, such as $CHF_3$, $C_2HF_5$, etc. that may form azeotropes with $C_2F_6$, resulting in the loss of valuable product. Furthermore, the presence of $NF_3$ having a close boiling point to $CF_4$ makes their separation by distillation practically impossible. At any rate, the recovered $C_2F_6$ and $CF_4$ gases will not be as pure as the virgin material and will cost more to produce.

As taught in U.S. application Ser. No. 09/542,995, filed Apr. 4, 2000, "Reclamation and Separation of Perfluorocarbons Using Condensation.", by W. T. McDermott, R. C. Ockovic, A. Schwarz, and R. Agrawal, cold trapping of PFC effluents, rather than membrane separation, may provide an economical feedstock for mixed PFC chamber clean processes. Separation of PFCs by condensation may not completely recover $C_2F_6$ and $CF_4$, i.e., recovered effluent is not separated into single components with all impurities present at trace levels. This is, however, more economical than distillation and can be used as mixed PFC source gas for CVD chamber cleaning.

In Andrew D. Johnson et al., "Minimizing PFC Emissions from Existing PECVD Tools: Optimization of the Chamber Clean Process of Record, *Semicon West* 2000, minimization of PFC emissions from cleaning PECVD chambers is described where the chamber clean process is optimized. Such optimization could occur by adjusting $C_2F_6$ flowrate, adjusting $O_2$:$C_2F_6$ ratio and/or adjusting pressure.

As indicated in M. A. Sobelewski, J. G. Langan, and B. S. Felker, "Electrical Optimization of Plasma-Enhanced Chemical Vapor Deposition Chamber Cleaning Plasmas," *J. Vac. Sci. Technol.*, B16, 173 (1998), the use of $C_2F_6$-based and $CF_4$-based plasmas to clean CVD equipment is widespread. Typically, $O_2$ is added to either $C_2F_6$ or $CF_4$ to inhibit polymer deposition and enhance the etch rate. Mixed PFCs are not expected to provide for improvements in cleaning performance.

Finally, in Nakata, Kubota, Kaji, Yoda and Okumura, "Reduction of PFC Emissions by Gas Recirculation Cleaning in Plasma CVD," *IEEE*, 2001, a process is disclosed that is directed to a method for cleaning a CVD chamber using gas recirculation. Unused gas contained in the exhaust gas is returned to the chamber by a pump. No virgin $C_2F_6$ or $CF_4$ is added.

It is principally desired to provide viable reuse of PFCs recovered from semiconductor tool effluents.

It is further desired to provide viable reuse of PFCs recovered from effluents that uses a mixed PFC source gas of $C_2F_6$ and $CF_4$ to clean, for example, CVD chambers.

It is still further desired to provide viable reuse of PFCs recovered from semiconductor tool effluents where it is not necessary to separate and purify recovered PFC effluents.

BRIEF SUMMARY OF THE INVENTION

The present invention is directed to improving the performance of a CVD chamber cleaning using recovered PFCs without subsequent purification. The relative concentrations of specific PFCs in the source gas can be chosen such that they are easily maintained by standard additions of specific virgin PFCs to the recovered mixed PFC product. Processes are chosen that do not result in a net increase in the amount of $CF_4$ and total gas volume. Specifically, higher $C_2F_6$ flow rates and $O_2$ concentrations result in sustainable $C_2F_6$-rich chamber clean processes. Other compounds present in the recovered stream, such as $N_2$ or $O_2$, can also be maintained at a fixed level by standard additions to the product.

Here, the strategy for achieving these emissions reductions is to capture the PFCs from the process effluent. Once captured, however, these PFCs are reused. This invention facilitates the recycling of the PFC gas mixture recovered from the effluent of semiconductor processing facilities.

The present invention is directed to a method of using PFCs recovered from the effluent of a CVD chamber cleaning process as an influent for the CVD chamber cleaning process. The method includes the steps of selecting a first PFC gas mixture having a first ratio of $C_2F_6$ to $CF_4$, and providing the first PFC gas mixture as the influent gas to the CVD chamber, wherein the influent gas reacts during the cleaning process to create a CVD chamber effluent gas comprising a second PFC gas mixture having a second ratio of $C_2F_6$ to $CF_4$. Virgin $C_2F_6$ or $CF_4$ is added to the CVD chamber effluent gas in sufficient quantity to create a third PFC gas mixture having the first ratio of $C_2F_6$ to $CF_4$. The third PFC gas mixture is then used as the influent gas to the CVD chamber. Virgin $C_2F_6$ or $CF_4$ continues to be added to the CVD chamber effluent gas to create the third PFC mixture and the third PFC gas mixture continues to be used as the influent gas to the CVD chamber.

$O_2$ may be provided to the third PFC gas mixture for use as influent gas to the CVD chamber.

The third ratio of $C_2F_6$ to $CF_4$ may be less than or equal to the following equation:

$$\frac{(1 - C + (C \cdot U))}{G \cdot C}$$

where U=Utilization of $CF_4$ in the plasma; G=Generation frequency of $CF_4$ from $C_2F_6$; and C=Capture efficiency of $CF_4$.

The third ratio of $C_2F_6$ to $CF_4$ may be less than or equal to about 0.32.

The third ratio of $C_2F_6$ to $CF_4$ is preferably greater than or equal to 1.

The third ratio of $C_2F_6$ to $CF_4$ is preferably adjusted by increasing the $O_2$ concentration and/or by using higher $C_2F_6$ flowrates.

The amount $CF_4$ in the effluent is preferably less than or equal to the amount of $CF_4$ in the influent.

The total gas volume of the effluent is preferably less than or equal to the total gas volume of the influent.

DETAILED DESCRIPTION OF THE INVENTION

The present invention is directed to cleaning CVD chambers using mixed PFC source gases. The composition of the CVD chamber clean feed stocks can be altered so that the recovered product can be reused simply by addition of virgin PFCs. $C_2F_6$, $CF_4$, and any other needed gases (e.g., $O_2$) can be added to the recovered material so that the product has a fixed composition. Chamber clean processes can then be developed which use this mixture, simplifying the reuse strategy.

Figure 1:
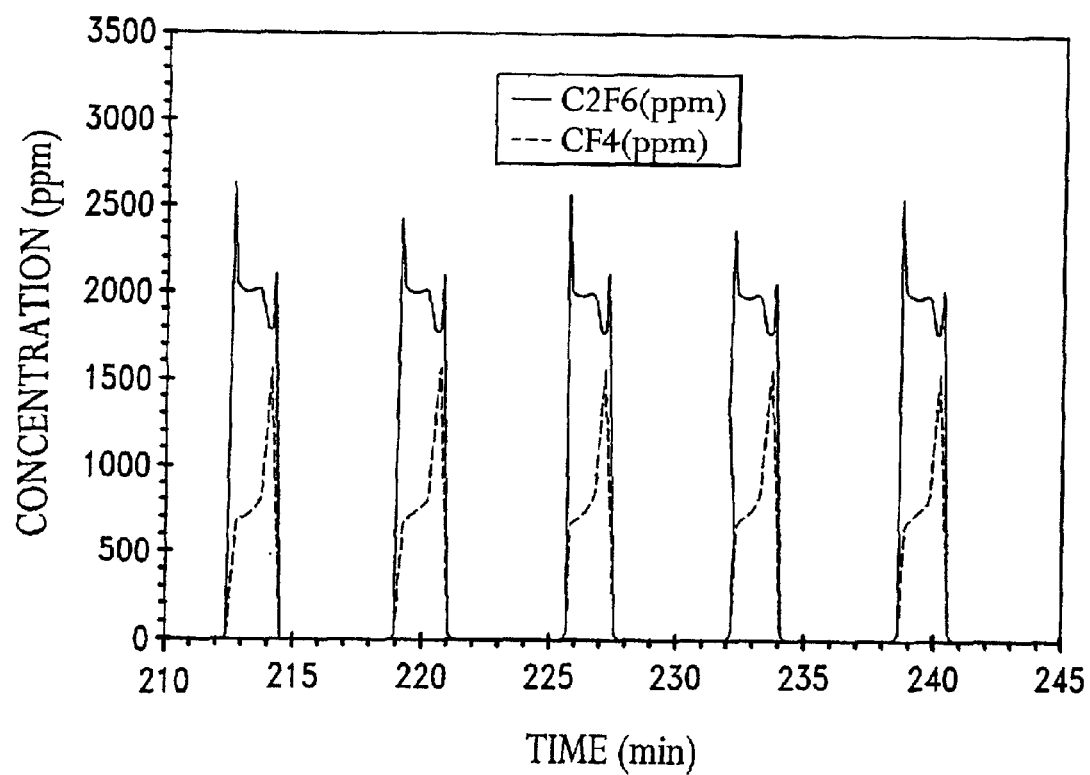
FIG. 1 is a graphical depiction of a concentration of PFCs in the effluent from a $C_2F_6$-based CVD chamber clean.

The main difficulty in using the recovered PFC material is the generation of $CF_4$ during the chamber clean process. The concentration of PFCs in the effluent of a semiconductor process tool is shown in FIG. 1 during a typical $C_2F_6$-based chamber clean process.

The gas usage, emissions and calculated utilization of $C_2F_6$ and generation of $CF_4$ are summarized below in Table 1.

TABLE 1

|  | Influent | $C_2F_6$Utilization | $CF_4$Generation | Effluent |
|---|---|---|---|---|
| $C_2F_6$ | 500 scc | 44% |  | 280 scc |
| $CF_4$ | 0 scc |  | 31.6% | 158 scc |

As described earlier, to reuse this captured effluent in current $C_2F_6$-based CVD chamber clean processes, the 158 scc (standard cubic centimeters) of $CF_4$, as indicated in the example of Table 1, must be removed. However, since $CF_4$ based plasmas are also used for CVD chamber cleaning, it is not necessary to separate the PFC mixture into its components, i.e., the recovered PFC mixture can be used directly as a source gas for CVD chamber clean processes. If the $CF_4$ and other compounds made in the chamber clean process are included in the influent gas, the recovered product can be reused by simple addition of those compounds that have higher utilization efficiencies. Using the $C_2F_6$ utilization and $CF_4$ generation efficiencies from Table 1, an example chamber clean process using mixed PFC source gas is summarized in Table 2. For this example, the total PFC flow rate is still 500 sccm (standard cubic centimeters per minute) and a typical $CF_4$ utilization (5%) is used.

TABLE 2

|  | Influent | Utilization | $CF_4$Generation | Effluent |
|---|---|---|---|---|
| $C_2F_6$ | 250 scc | 44% |  | 140 scc |
| $CF_4$ | 250 scc | 5% | 32% | 318 scc |

To achieve the same ratio of gases as for the starting material, 178 scc of $C_2F_6$ is added to the recovered product. That is, by adding 178 scc of $C_2F_6$ to the 140 scc effluent, there are 318 scc of $C_2F_6$ and 318 scc of $CF_4$ Note that this assumes the capture efficiencies of $C_2F_6$ and $CF_4$ are both 100%. Although the total volume of the reconstituted gas, 636 scc (i.e., 140 scc $C_2F_6$+178 scc $C_2F_6$+318 scc $CF_4$), is greater than the influent gas (500 scc), its composition is the same and can be reused in the mixed $C_2F_6/CF_4$-based process.

The example summarized in Table 2 illustrates the problem associated with the formation of $CF_4$ during the clean process. If equal amounts of $C_2F_6$ and $CF_4$ are used as a source gas, the low utilization of $CF_4$ (5%) results in the $CF_4$ emission (318 scc) being larger than the influent (250 scc), i.e., more $CF_4$ is generated from $C_2F_6$ than is utilized in the plasma. Consequently, virgin $C_2F_6$ must be added to the recovered PFC mixture, which increases the total gas volume 27%. More PFC gas is generated than can be reused in the semiconductor process. The excess must again be stored indefinitely or be destroyed/abated if emissions reductions are to be meaningful.

The solution to this problem is to adjust the influent ratio of $C_2F_6$ and $CF_4$ so that there is a net decrease in $CF_4$ (i.e., the volume of $CF_4$ generated must be less than the volume of $CF_4$ recovered). Since no $C_2F_6$ is generated in the plasma, the volume of $C_2F_6$ effluent will always be less than its influent. From this condition, the limiting composition for the influent PFC gas mixture can be calculated:

$$\frac{C_2F_6}{CF_4} \leq \frac{(1-C+(C \cdot U))}{G \cdot C};$$ Equation 1 where:

U=Utilization of $CF_4$ in the plasma;

G=Generation frequency of $CF_4$ from $C_2F_6$; and

C=Capture efficiency of $CF_4$

An example mixed PFC process ($C_2F_6/CF_4$=0.32) that satisfies the condition (Equation 1) is summarized in Table 3.

TABLE 3

| | Influent | Utilization | $CF_4$ Generation | Capture Efficiency | Recovered |
|---|---|---|---|---|---|
| $C_2F_6$ | 120 scc | 44% | | 95% | 64 scc |
| $CF_4$ | 380 scc | 5% | 32% | 95% | 379 scc |

Since the volume of recovered $CF_4$ is less than its influent, the total gas volume (500 scc) does not increase when the influent composition ($C_2F_6/CF_4$=0.32) is reconstituted by addition of virgin $C_2F_6$ (56 scc).

Figure 2:
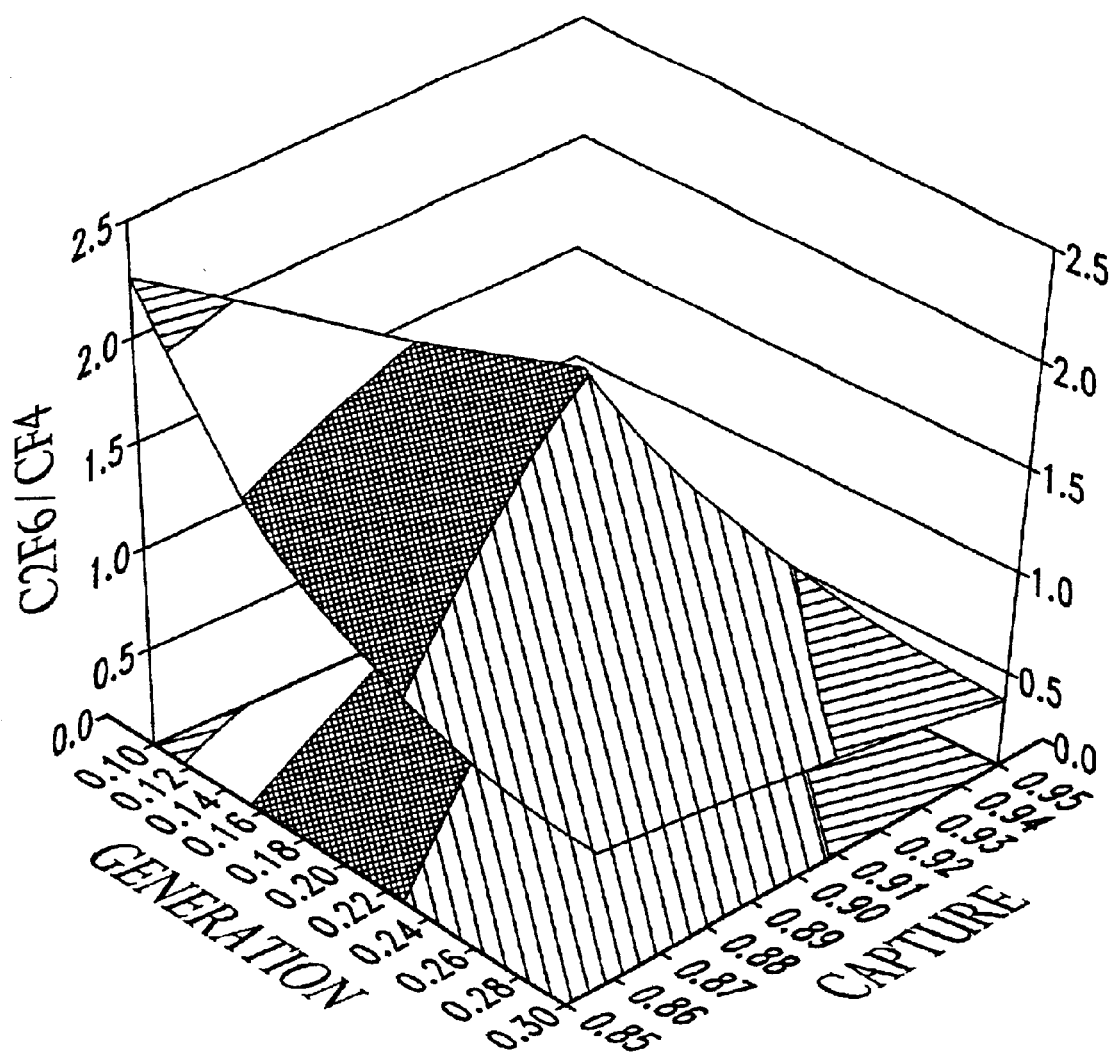
FIG. 2 is a graphical depiction of volume of the ratio of $C_2F_6$ to $CF_4$ as a function of generation frequency of $CF_4$ from $C_2F_6$ and capture efficiency of $CF_4$ with respect to a preferred embodiment of the present invention.

The process summarized in Table 3 is not, however, desirable for chamber cleaning because it is a $CF_4$-rich plasma. Since most CVD chamber clean processes are $C_2F_6$-based chemistries, a process where $C_2F_6/CF_4$ is greater than one is more acceptable. The sustainable PFC composition (Equation 1) is quite sensitive to the capture efficiency (C) and $CF_4$ generation frequency (G) as shown in FIG. 2.

Figure 3:
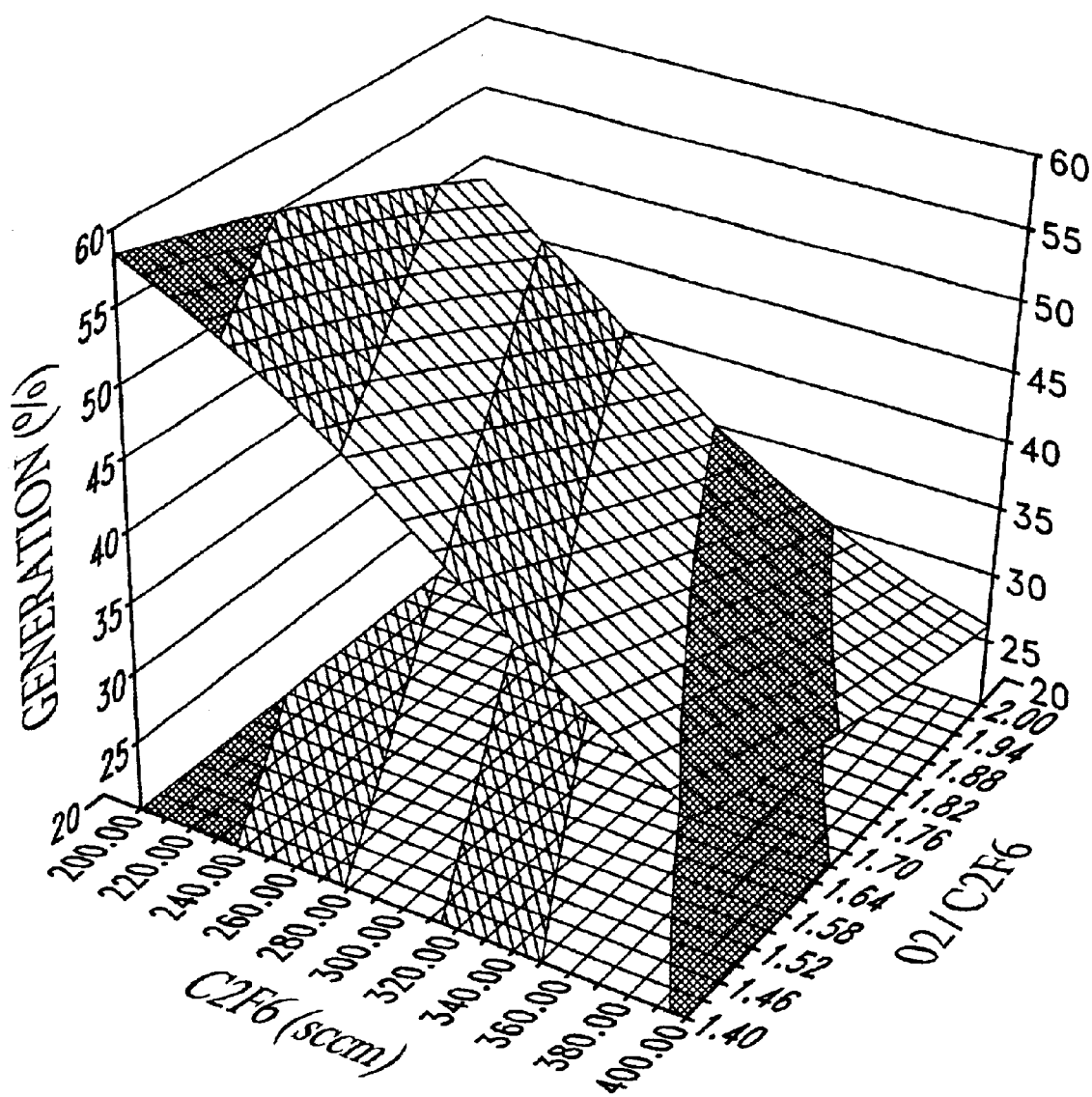
FIG. 3 is a graphical depiction of generation frequency of $CF_4$ from $C_2F_6$ as a function of $C_2F_6$ flowrate and the ratio of $O_2$ to $C_2F_6$ with respect to a preferred embodiment of the present invention.

Sustainable $C_2F_6$-rich chamber clean processes are achievable by reducing the $CF_4$ generation frequency (G) or $CF_4$ capture efficiency (C). Concerns over global warming have motivated the semiconductor industry to optimize their $C_2F_6$-based chamber clean processes. See, e.g. A. D. Johnson, W. R. Entley, and P. J. Maroulis, "Reducing PFC Gas Emissions from CVD Chamber Cleaning," *Solid State Technology*, p. 103, December 2000. Optimization involves adjusting the process parameters so as to reduce PFC emissions without increasing the time needed to clean the CVD chamber. Optimized chamber clean processes generally have a lower $C_2F_6$ flow rate, lower $O_2$ concentration, and higher pressure. Unfortunately, this strategy increases the amount of $C_2F_6$ converted to $CF_4$. See FIG. 3. An alternative strategy is possible if the PFC effluents are captured for reuse. By increasing the $O_2$ concentration and using higher $C_2F_6$ flow rates (FIG. 3), the $CF_4$ generation can be reduced substantially (FIG. 3). Although these processes have higher $C_2F_6$ flow rates, this is unimportant if the effluent is captured and reused.

Table 4 provides an example $C_2F_6$-rich chamber clean process whereby the recovered effluent can be reused without generating excess mixed PFC product. Higher flow rates are expected to result in a lower $C_2F_6$ utilization. Since the process effluent is recovered, this should be a minor contributor to PFC emissions (which depends upon the $C_2F_6$ capture efficiency). Lower $C_2F_6$ utilizations provide the benefit of reducing the amount of virgin $C_2F_6$ necessary to restore initial PFC composition.

TABLE 4

| | Influent | Utilization | $CF_4$ Generation | Capture Efficiency | Recovered |
|---|---|---|---|---|---|
| $C_2F_6$ | 1000 scc | 20% | | 90% | 720 scc |
| $CF_4$ | 1000 scc | 5% | 15% | 90% | 990 scc |

Although illustrated and described herein with reference to specific embodiments, the present invention nevertheless is not intended to be limited to the details shown. Rather, various modifications may be made in the details within the scope and range of equivalents of the claims without departing from the spirit of the invention.

What is claimed is:

1. A method of using PFCs recovered from the effluent of a CVD chamber cleaning process as an influent for the CVD chamber cleaning process, comprising the steps of:

(a) selecting a first PFC gas mixture having a first ratio of $C_2F_6$ to $CF_4$ wherein the first ratio of $C_2F_6$ to $CF_4$ is less than or equal to the following equation:

$$\frac{(1-C+(C \cdot U))}{G \cdot C}$$

where U=Utilization of $CF_4$ in the plasma; G=Generation frequency of $CF_4$ from $C_2F_6$; and C=Capture efficiency of $CF_4$, (b) providing the first PFC gas mixture as the influent gas to the CVD chamber, wherein the influent gas reacts during the cleaning process to create a CVD chamber effluent gas comprising a second PFC gas mixture having a second ratio of $C_2F_6$ to $CF_4$;

(c) adding virgin $C_2F_6$ or $CF_4$ to the CVD chamber effluent gas in sufficient quantity to create a third PFC gas mixture having the first ratio of $C_2F_6$ to $CF_4$;

(d) using the third PFC gas mixture as the influent gas to the CVD chamber; and (e) continuing to add virgin $C_2F_6$ or $CF_4$ to the CVD chamber effluent gas to create the third PFC mixture and continuing to use the third PFC gas mixture as the influent gas to the CVD chamber.

2. A method of using PFCs recovered from the effluent of a CVD chamber cleaning process as an influent for the CVD chamber cleaning process, comprising the steps of:

(a) selecting a first PFC gas mixture having a first ratio of $C_2F_6$ to $CF_4$ wherein the first ratio of $C_2F_6$ to $CF_4$ is less than or equal to about 0.32;

(b) providing the first PFC gas mixture as the influent gas to the CVD chamber, wherein the influent gas reacts during the cleaning process to create a CVD chamber effluent gas comprising a second PFC gas mixture having a second ratio of $C_2F_6$ to $CF_4$;

(c) adding virgin $C_2F_6$ or $CF_4$ to the CVD chamber effluent gas in sufficient quantity to create a third PFC gas mixture having the first ratio of $C_2F_6$ to $CF_4$;

(d) using the third PFC gas mixture as the influent gas to the CVD chamber; and (e) continuing to add virgin $C_2F_6$ or $CF_4$ to the CVD chamber effluent gas to create the third PFC mixture and continuing to use the third PFC gas mixture as the influent gas to the CVD chamber.

3. A method of using PFCs recovered from the effluent of a CVD chamber cleaning process as an influent for the CVD chamber cleaning process, comprising the steps of:

(a) selecting a first PFC gas mixture having a first ratio of $C_2F_6$ to $CF_4$ greater than or equal to 1;

(b) providing the first PFC gas mixture as the influent gas to the CVD chamber, wherein the influent gas reacts during the cleaning process to create a CVD chamber effluent gas comprising a second PFC gas mixture having a second ratio of $C_2F_6$ to $CF_4$;

(c) adding virgin $C_2F_6$ or $CF_4$ to the CVD chamber effluent gas in sufficient quantity to create a third PFC gas mixture having the first ratio of $C_2F_6$ to $CF_4$;

(d) using the third PFC gas mixture as the influent gas to the CVD chamber; and (e) continuing to add virgin $C_2F_6$ or $CF_4$ to the CVD chamber effluent gas to create the third PFC mixture and continuing to use the third PFC gas mixture as the influent gas to the CVD chamber.

4. The method of claim 3, including the step of providing $O_2$ to the third PFC gas mixture for use as influent gas to the CVD chamber.

5. The method of claim 3, wherein the third ratio of $C_2F_6$ to $CF_4$ is adjusted by increasing the $O_2$ concentration.

6. The method of claim 3, wherein the third ratio of $C_2F_6$ to $CF_4$ is adjusted by using higher $C_2F_6$ flowrates.

7. The method of claim 3, wherein the amount $CF_4$ in the effluent is less than or equal to the amount of $CF_4$ in the influent.

8. The method of claim 3, wherein the total gas volume of the effluent is less than or equal to the total gas volume of the influent.

* * * * *